United States Patent
Park et al.

(10) Patent No.: US 7,408,821 B2
(45) Date of Patent: Aug. 5, 2008

(54) METHOD FOR ERROR COMPENSATION AND A MEMORY CONTROL DEVICE ADAPTED FOR ERROR COMPENSATION

(75) Inventors: Young-Jin Park, Bucheon-si (KR); Kyu-Sung Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 126 days.

(21) Appl. No.: 11/410,018

(22) Filed: Apr. 25, 2006

(65) Prior Publication Data

US 2007/0047339 A1     Mar. 1, 2007

(30) Foreign Application Priority Data

Aug. 23, 2005   (KR) .................. 10-2005-0077556

(51) Int. Cl.
*G11C 7/00*   (2006.01)

(52) U.S. Cl. .................. 365/194; 365/193; 365/233.1; 702/106

(58) Field of Classification Search .................. 365/193, 365/194, 233, 233.1; 702/106
See application file for complete search history.

(56) References Cited

U.S. PATENT DOCUMENTS 6,400,641 B1   6/2002   Manning
6,985,401 B2 *   1/2006   Jang et al. .................. 365/233
7,171,321 B2 *   1/2007   Best .......................... 702/106

FOREIGN PATENT DOCUMENTS

| EP | 1492121 | 12/2004 |
|---|---|---|
| JP | 2005-078547 | 3/2005 |
| KR | 10-2003-0056811 | 7/2003 |

* cited by examiner

*Primary Examiner*—Hoai V Ho
(74) *Attorney, Agent, or Firm*—Roylance, Abrams, Berdo & Goodman, L.L.P.

(57) ABSTRACT

A memory control device and a memory control method are provided to compensate for additional delay subsequent to the change in environmental factors and to permit a smooth writing operation. The memory control device includes a controller that calculates a number of delay cells that are necessary to delay a system clock for one period as delay information, and a compensation unit that generates a compensation control signal by using the delay information calculated by the controller signal. The compensation unit compensates for an additional delay which is subsequent to a change in environmental factors such as voltage or temperature.

8 Claims, 5 Drawing Sheets

METHOD FOR ERROR COMPENSATION AND A MEMORY CONTROL DEVICE ADAPTED FOR ERROR COMPENSATION

CROSS-REFERENCED TO RELATED APPLICATIONS

This application claims the benefit under 35 U.S.C. §119(a) of Korean Patent Application No 2005-77556, filed on Aug. 23, 2005, in the Korean Intellectual Property Office, the entire disclosure of which is hereby incorporated by reference.

BACKGROUND OF THE INVENTION

1. Field of the Invention

The present invention relates generally to a memory control device and a memory control method thereof. More particularly, the present invention relates to a memory control device and method which compensates for errors occurring when data is written to a memory and enables a smooth writing operation.

2. Description of the Related Art

A memory includes a recording medium that writes and reads data. A Dynamic Random Access Memory (DRAM) exemplifies such memory and is divided into a single data rate (SDR) memory and a double data rate (DDR) memory according to a data transmission rate per strobe. The SDR memory writes or reads data at a rising edge of a strobe and allows a single time data writing or reading operation per one strobe period.

On the other hand, the DDR memory writes or reads data at both a rising edge and falling edge of a strobe and allows two data writing or reading operations per one strobe period. Therefore, compared to the SDR memory, the DDR memory has a narrow valid data window (VDW) during which the memory writes or reads data smoothly.

In order to write or read data accurately through the narrow VDW, a memory control device is required. The memory control device is embedded in an application specific integrated circuit (ASIC) as shown in FIG. 1.

FIG. 1 is a view illustrating an ASIC 1 having a conventional memory control device.

Referring to FIG. 1, a conventional memory control device 10 is embedded in the ASIC 1 and performs an interfacing between the ASIC 1 and a DDR memory 20. The memory control device 10 comprises a delay compensation circuit (DCC) 11, first clock tree synthesis (CTS) 13, second CTS 15, strobe generator 17 and data generator 19.

The DCC 11 receives a system clock (referred to as 'SYSTEM CLK') provided by the ASIC 1 and calculates delay information that is necessary to delay the SYSTEM CLK for one period. When the DDR memory 20 provides a DRAM data strobe (referred to as 'read_dqs signal') and a data signal (referred to as 'read_data signal'), the DCC 11 delays the 'read_dqs signal' based on the delay information in order to read the read_data signal at a rising edge and a falling edge of the 'read_dqs signal'.

The DCC 11 delays a strobe generation control signal (referred to as 'clk_dqs_out signal') and a data generation control signal (referred to as 'clk_wr signal') that are necessary to generate a strobe signal (referred to as 'write_dqs signal') for writing data and generating a data signal (referred to as 'data_out signal'), respectively, based on the delay information, and the DCC 11 then outputs the delayed signals.

The strobe generator 17 generates the write_dqs signal using a single line clk_dqs_out signal and a single line clk_wr signal. The data generator 19 generates the data_out signal of 8 bits using the eight-line clk_wr signals.

The first CTS 13 comprises a buffer for delaying the clk_dqs_out signal and the clk_wr signal, respectively, such that the clk_dqs_out signal and the clk_wr_signal arrive at the strobe generator 17 with a same phase. That is, the first CTS 13 additionally delays such that the single line clk_dqs_out signal and the single line clk_wr signal output from the DCC 11 have the same phase.

The second CTS 15 comprises a buffer for additionally delaying such that the eight-line clk_wr signals provided by the data generator 19 have the same phase.

Since the clk_dqs_out signal and the clk_wr signal output from the DCC 11 are additionally delayed by the CTS 13 and CTS 15, a VDW of the data_out signal becomes narrowed and a phase difference between the SYSTEM CLK and the write_dqs_out signal becomes larger due to the additional delay.

FIG. 2 is a view illustrating an output signal of the ASIC 1 having the conventional memory control device 10.

FIG. 2 illustrates an example case where the phase of the clk_dqs_out signal output from the DCC 11 is delayed as much as 90°, and the phase of the clk_wr signal output from the DCC 11 is delayed as much as 180°.

The clk_dqs_out signal delayed as much as 90° and the clk_wr signal delayed as much as 180° are additionally delayed by the first CTS 13 and the second CTS 15. The write_dqs signal output from the conventional memory control device 10 has a phase difference of 90° or more in accordance with the SYSTEM CLK which results in a narrow VDW of the data_out signal.

Also, the DDR memory 20 stores data A, B, C, D read at the rising edge and the falling edge of the write_dqs signal. However, since the data A, B, C, D falls outside the VDW, accurate data cannot be obtained To this end, a writing error is likely to occur in the DDR memory 20. The writing error is more problematic when there are changes in environmental factors, such as voltage, temperature, and noise caused by a transmission channel characteristic. As a result, a smooth writing operation of the DDR memory 20 cannot be achieved due to the additional delay of the first CTS 13 and the second CTS 15.

Accordingly, there is a need for an improved memory control device and method to compensate for errors occurring when data is written to a memory and to enable a smooth writing operation.

SUMMARY OF THE INVENTION

An aspect of exemplary embodiments of the present invention is to address at least the above problems and/or disadvantages and to provide at least the advantages described below. Accordingly, an aspect of exemplary embodiments of the present invention is to provide a memory control device and method which compensates for a writing error resulting from changes in at least one of voltage, temperature and noise caused by a transmission channel characteristic, thereby achieving a smooth writing operation.

The above aspect of an exemplary embodiment of the present invention is achieved by providing a memory control device including a controller that calculates a number of delay cells that are necessary to delay a system clock for one period as delay information, and a compensation unit that generates a compensation control signal by using the delay information calculated by the controller signal, thereby compensating for additional delay subsequent to a change in environmental factors in at least one of a voltage and temperature.

Preferably, the controller includes a phase detector that receives the system clock and outputs two signals having a phase difference therebetween, a delay controller that calculates the number of delay cells that are necessary to delay the system clock for one period as the delay information, by using the two system clocks having the phase difference, and a control signal generator that generates a first control signal by passing the system clock through a certain number of delay cells based on the delay information, and generates a second control signal to have a phase difference with respect to the first control signal, and outputs the first and the second control signals to interface with a predetermined memory.

Preferably, the control signal generator receives the compensation control signal output from the compensation unit and compensates for an additional delay that is subsequent to an operation of writing data to the memory.

Further, the memory control device includes a strobe generator that generates a clock signal to transmit data to the memory by using the first and second control signals, a data generator that generates a data signal transmitted to the memory by using the second control signal, a first additional delayer that additionally delays one first control signal and one second control signal such that the first and second control signals are input into the strobe generator with the same phase, and a second additional delayer that additionally delays eight-second control signals such that the eight-second control signals are input into the data generator with the same phase.

Preferably, the compensation unit generates the compensation control signal using additional delay values of the first additional delayer and the second additional delayer that correspond to the delay information changing depending on the change in the environmental factors.

The above aspect of an exemplary embodiment of the present invention is also achieved by providing a memory control method including calculating a number of delay cells that are necessary to delay a system clock for one period as delay information, and generating a compensation control signal by using the delay information calculated by the controller, thereby compensating for an additional delay which is subsequent to a change in an environmental factor in at least one of a voltage and temperature.

Preferably, the delay information calculation operation includes receiving the system clock and outputting two system clocks having a phase difference therebetween, and calculating the number of delay cells that are necessary to delay the system clock for one period by using the two system clocks having the phase difference.

Preferably, the memory control method further includes receiving the compensation control signal and compensating for an additional delay that is subsequent to an operation of writing data.

Other objects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above aspect and other objects, features and advantages of certain exemplary embodiments of the present invention will be more apparent from the following description taken in conjunction with the accompanying drawings, in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
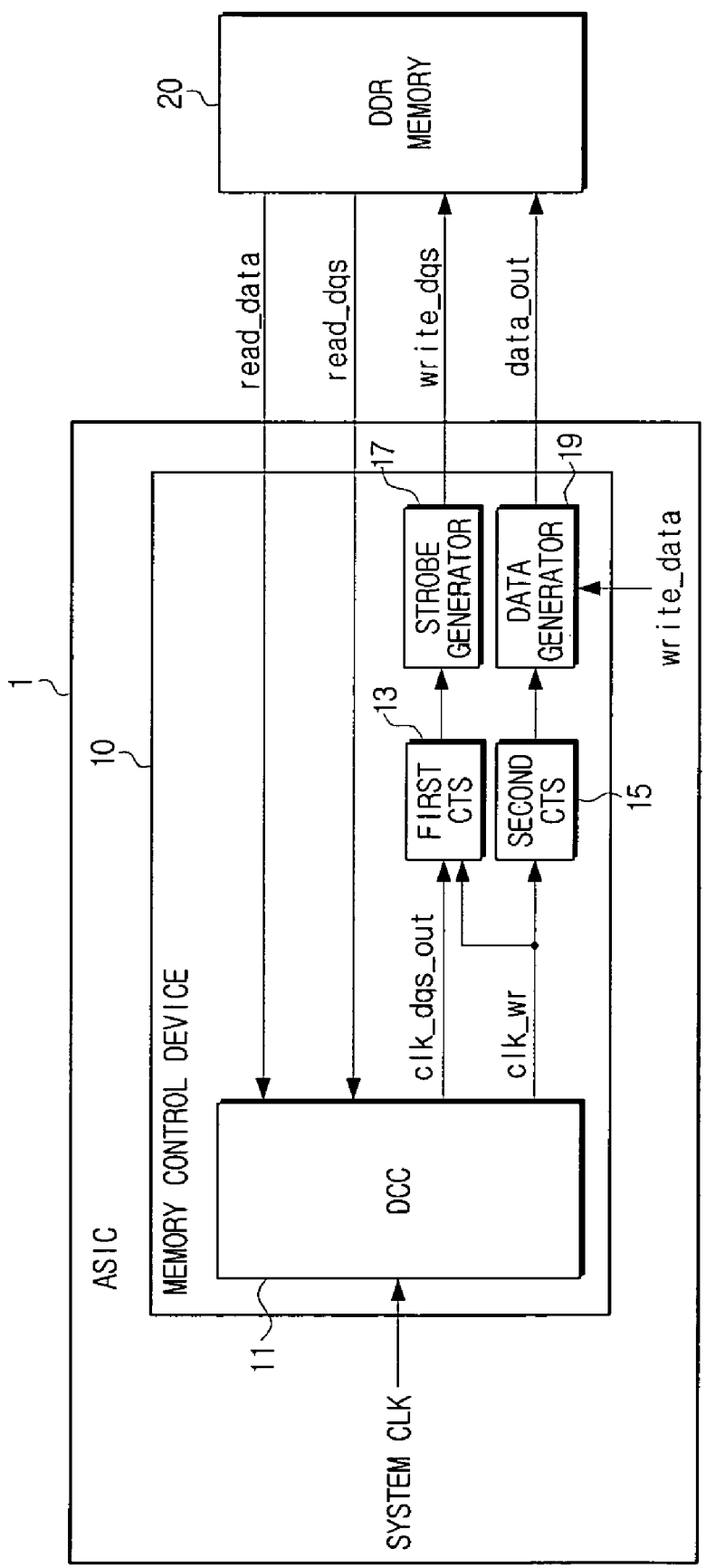
FIG. 1 is a view illustrating an ASIC having a conventional memory control device.
Figure 2:
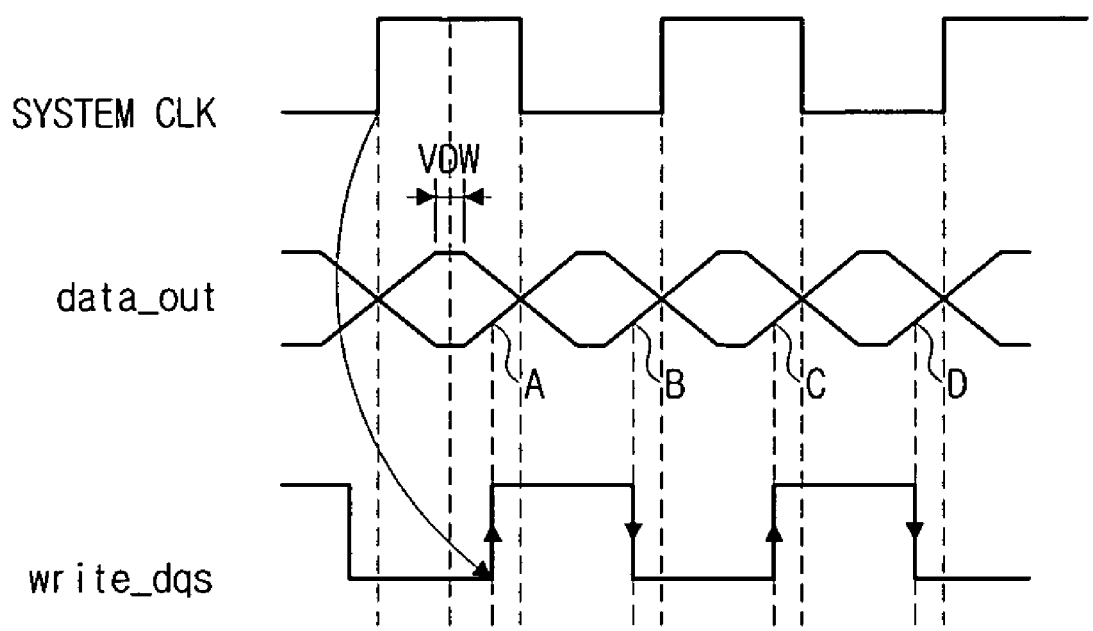
FIG. 2 is a view illustrating output signals of the ASIC having the conventional memory control device.
Figure 3:
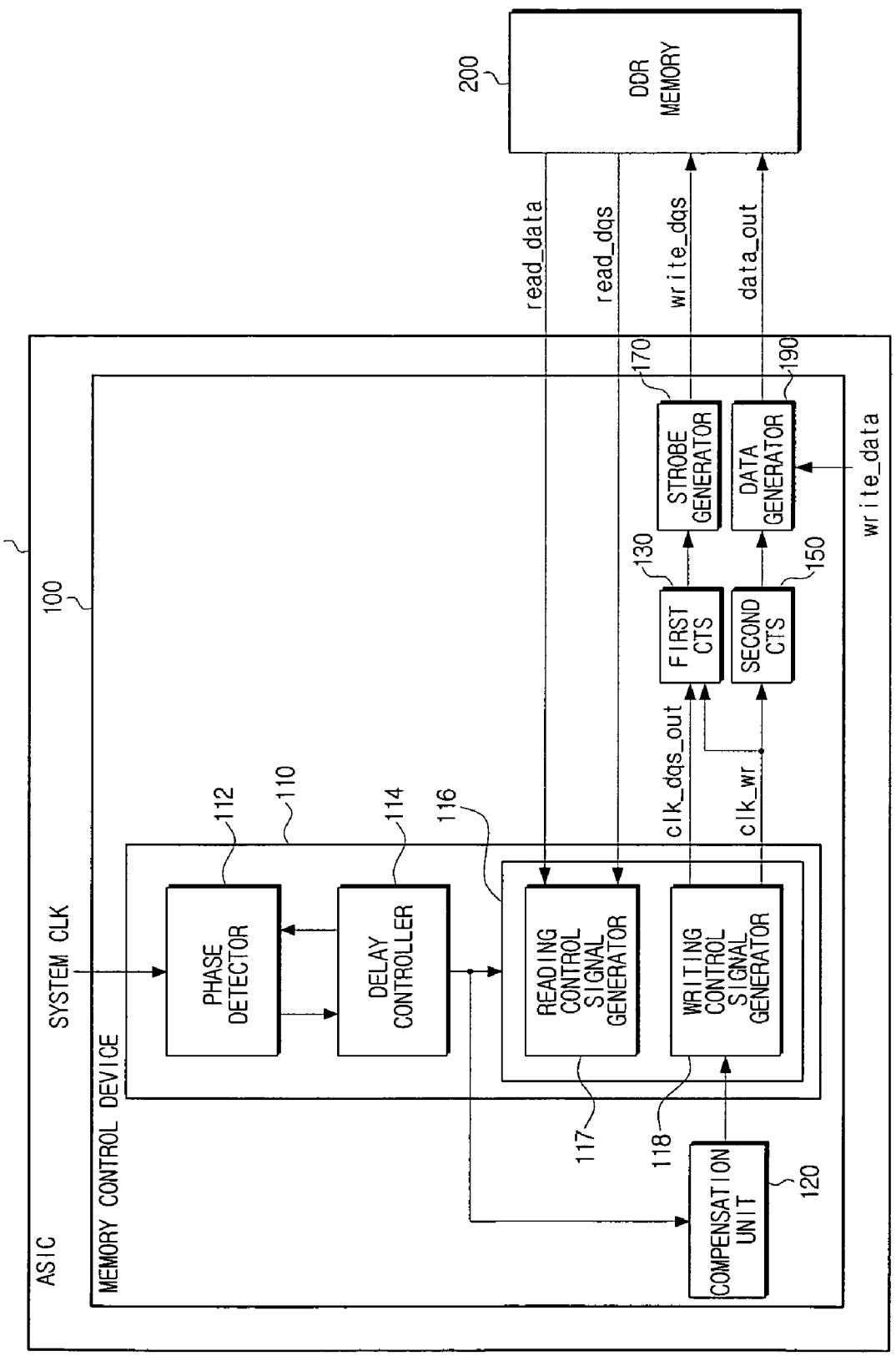
FIG. 3 is a block diagram illustrating a memory control device according to an exemplary embodiment of the present invention.

FIG. 3 is a block diagram illustrating a memory control device according to an exemplary embodiment of the present invention.

Referring to FIG. 3, a memory control device 100 is embedded in an ASIC 1 and performs an interfacing between the ASIC 1 and a DDR memory 200. The memory control device 100 comprises a DCC 110, compensation unit 120, first CTS 130, second CTS 150, strobe generator 170 and data generator 190.

The DCC 110 comprises a phase detector 112, delay controller 114 and control signal generator 116.

The phase detector 112 receives a SYSTEM CLK provided by the ASIC 1 and outputs two signals having a phase difference therebetween. For example, the phase detector 112 passes the SYSTEM CLK through a certain number of delay cells, thereby outputting a first phase SYSTEM CLK, and passes the SYSTEM CLK through two more delay cells, thereby outputting a second phase SYSTEM CLK.

The delay controller 114 calculates delay information that is necessary to delay the SYSTEM CLK for one period, by using the first phase and the second phase SYSTEM CLKs output from the phase detector 112. For example, the delay controller 114 adjusts the number of delays cells of the phase detector 112 to place one of the first phase or the second phase SYSTEM CLKs in a high state and the remaining phase SYSTEM CLK one in a low state, and calculates the number of delay cells to delay the SYSTEM CLK for one period as the delay information.

As an example, if the delay controller 114 passes the first phase SYSTEM CLK through 99 delay cells and passes the second phase SYSTEM CLK through 101 delay cells to place one of the first phase or the second phase SYSTEM CLKs in the high state and the other remaining phase SYSTEM CLK in the low state, the total number of delay cells to delay the SYSTEM CLK for one period is 100.

The control signal generator 116 generates a control signal to read data stored in the DDR memory 200 and a control signal to write data to the DDR memory 200. The control signal generator 116 comprises a reading control signal generator 117 and a writing control signal generator 118.

The reading control signal generator 117 delays a read_dqs signal provided by the DDR memory 200 based on the delay information to read a read_data signal provided by the DDR memory 200 at a rising edge and falling edge of the read_dqs signal.

Since the read_data signal and read_dqs signal have a phase difference of 90° therebetween, the reading control signal generator 117 delays the read_dqs signal such that an edge of the read_dqs signal is located in a VDW of the read_data signal. If 100 delay cells are available, the read-dqs signal passes through 25 delay cells such that a phase difference between the read_data signal and the read_dqs signal is 90°.

The writing control signal generator 118 delays a clk_dqs_out signal and a ckl_wr that are necessary to generate a write_dqs signal and a data_out signal based on a compensation control signal output from the compensation unit 12, and outputs the delayed signals.

For example, in order for a phase of the write_dqs signal to start 90° later than the SYSTEM CLK and a phase of the data_out signal to start 90° later than the write_dqs signal, the writing control signal generator 118 outputs the clk_dqs_out signal that starts later than the SYSTEM CLOCK by less than 90°, and the clk_wr signal that starts later than the SYSTEM CLK by less than 180° based on the compensation control signal.

If 100 pieces of delay information are available, the writing control signal generator 118 passes the SYSTEM CLK through 23 delay cells, thereby outputting the clk_dqs_out signal that is phase-delayed by less than 90°, and passes the SYSTEM CLK through 46 delay cells, thereby outputting the clk_wr signal that is phase-delayed by less than 180°.

The compensation unit 120 outputs a compensation control signal to compensate for an error that occurs due to the changes in environmental factors when the writing control signal generator 118 writes data to the DDR memory 200 based on the delay information calculated by the delay controller 114. The compensation unit 120 then provides the compensation control signal to the writing control signal generator 118.

That is, the compensation unit 120 estimates an additional delay value that is generated by the first CTS 130 and second CTS 150 due to the changes in the voltage, temperature and noise caused by a transmission channel characteristic, and controls the writing control signal generator 118 to not pass the clk_dqs_out signal and the clk_wr signal through a number of delay cells corresponding to the estimated additional delay value.

The compensation unit 120 stores the CTS additional delay values based on the delay information as shown in the following Table 1.

TABLE 1

| (V) | (° C.) | CTS additional delay value (ns) | | Delay Information (Number of delay cells) | Delay cell passing time (ps) | Compensation value (Number of delay cells) | |
|---|---|---|---|---|---|---|---|
| | | Clk_wr | Clk_dqs_out | | | Clk_wr | Clk_dqs_out |
| 1.10 | 125 | 1.20 | 1.00 | 32 | 313 | 4 | 3 |
| 1.12 | 115 | 1.13 | 0.90 | 35 | 310 | 4 | 3 |
| 1.16 | 110 | 1.01 | 0.82 | 41 | 304 | 3 | 3 |
| 1.19 | 75 | 0.93 | 0.75 | 62 | 225 | 4 | 3 |
| 1.21 | 74 | 0.84 | 0.63 | 68 | 219 | 4 | 3 |
| 1.22 | 71 | 0.72 | 0.50 | 77 | 208 | 3 | 2 |
| 1.30 | −35 | 0.63 | 0.45 | 95 | 140 | 5 | 3 |
| 1.32 | −38 | 0.54 | 0.32 | 100 | 133 | 4 | 2 |
| 1.35 | −40 | 0.48 | 0.23 | 107 | 125 | 4 | 2 |

Referring to Table 1, if the delay information calculated by the delay controller 114 is 100, the compensation unit 120 estimates the CTS additional delay value of 0.54 ns for the clk_wr signal and the CTS additional delay value of 0.32 ns for the clk_dqs_out signal.

In order to compensate for the CTS additional delay, the compensation unit 120 controls the writing control signal generator 118 to compensate for the number of delay cells as much as a compensation value. For example, the compensation unit 120 controls the writing control signal generator 118 to pass the clk_wr signal through 100 delay cells less four (4) to make a phase difference between the SYSTEM CLK and the clk_wr signal less than 180°. Also, the compensation unit 120 controls the writing control signal generator 118 to pass the clk_dqs_out signal through 100 delay cells less two (2) to make a phase difference between the SYSTEM CLK and the clk_dqs_out signal less than 90°.

As shown in Table 1, when the voltage is low and the temperature is high, the memory is in a worst state. For example, if the voltage is low and the temperature is high, the CTS additional delay value increases and thus the number of delay cells to be compensated increases. Alternatively, when the voltage is high and the temperature is low, the memory is in the optimal state.

The first CTS 130 comprises a buffer that delays the clk_dqs_out signal and the clk_wr signal for a certain time such that the clk_dqs_out signal and the clk_wr signal arrive at the strobe generator 170 with the same phase. In other words, the first CTS 130 additionally delays the single-line clk_dqs_out signal and the single-line clk_wr signal output from the writing control signal generator 118 to have the same phase.

The first CTS 130 additionally delays the clk_dqs_out signal and the clk_wr signal that are delayed by less than 90° and by less than 180° respectively at the writing control signal generator 118 to have the same phase 90°.

The second CTS 150 additionally delays the eight-line clk_wr signals provided to the data generator 190 to have the same phase. For example, the second CTS 150 additionally delays the eight-line clk_wr signals that are delayed by less than 180° at the writing control signal generator 118 to prevent the clk_wr signals from having different phases due to the transmission channel characteristic, and outputs the 180°-phase-delayed clk_wr signals to the data generator 190.

Figure 4:
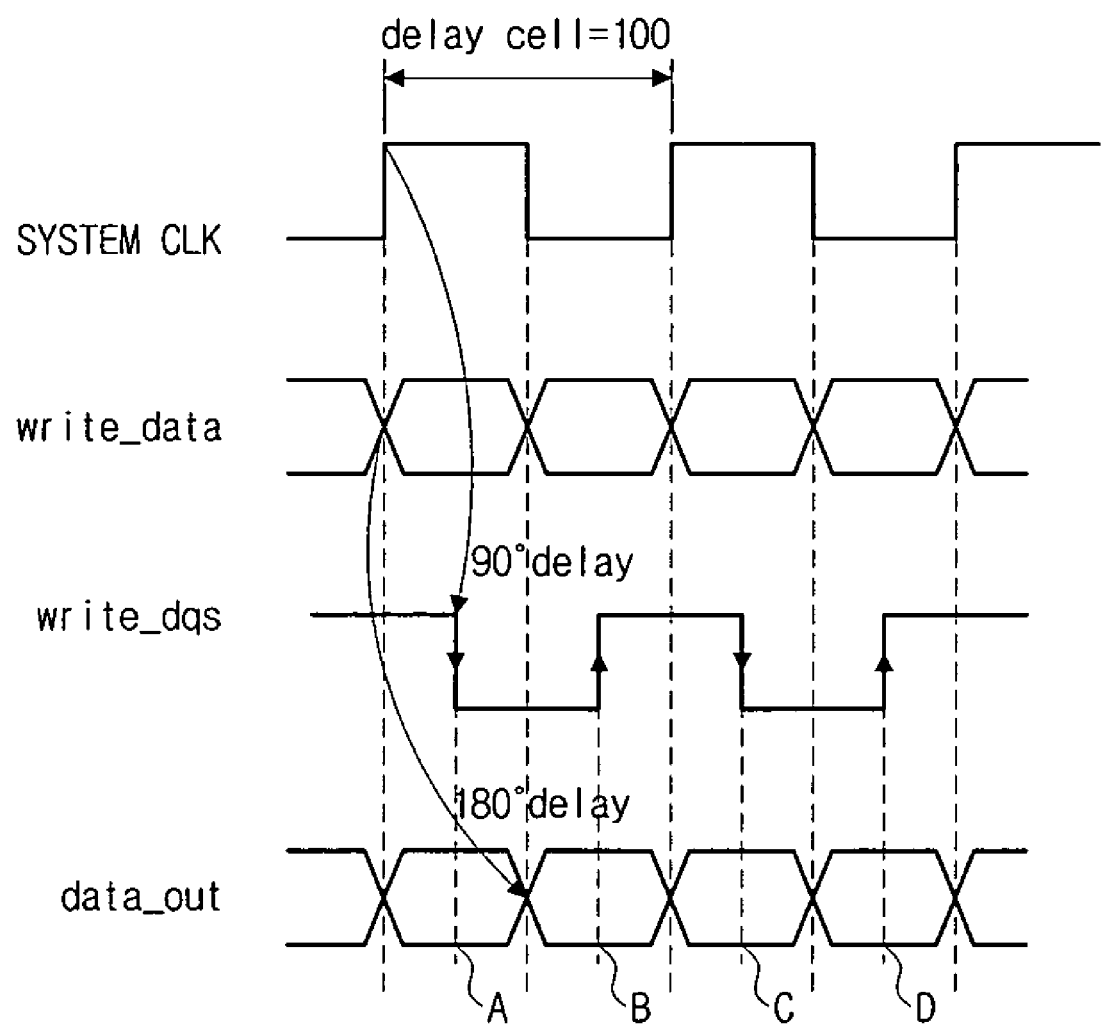
FIG. 4 is a view illustrating output signals of an ASIC having the memory control device according to an exemplary embodiment of the present invention.

FIG. 4 is view illustrating output signals of the ASIC having the memory control device according to an exemplary embodiment of the present invention.

Referring to FIG. 4, the memory control device 100 according to an exemplary embodiment of the present invention has the SYSTEM CLK consisting of 100 delay cells and compensates for the CTS additional delay caused by the change in the environmental factors to generate a 90°-phase delayed write_dqs signal and a 180°-phase-delayed data_out signal.

The writing control signal generator 118 compensates for the clk_dqs_out signal and the clk_wr signal based on the compensation control signal output from the compensation unit 120 and outputs the compensated signals. The 90°-phase-delayed write_dqs signal is generated by the clk_dqs_out signal and the clk_wr signal that are compensated for as much as the CTS additional delay values, and the 180°-phase-delayed data_out signal is generated by the clk_wr signal that is compensated for as much as the CTS additional delay value.

Figure 5:
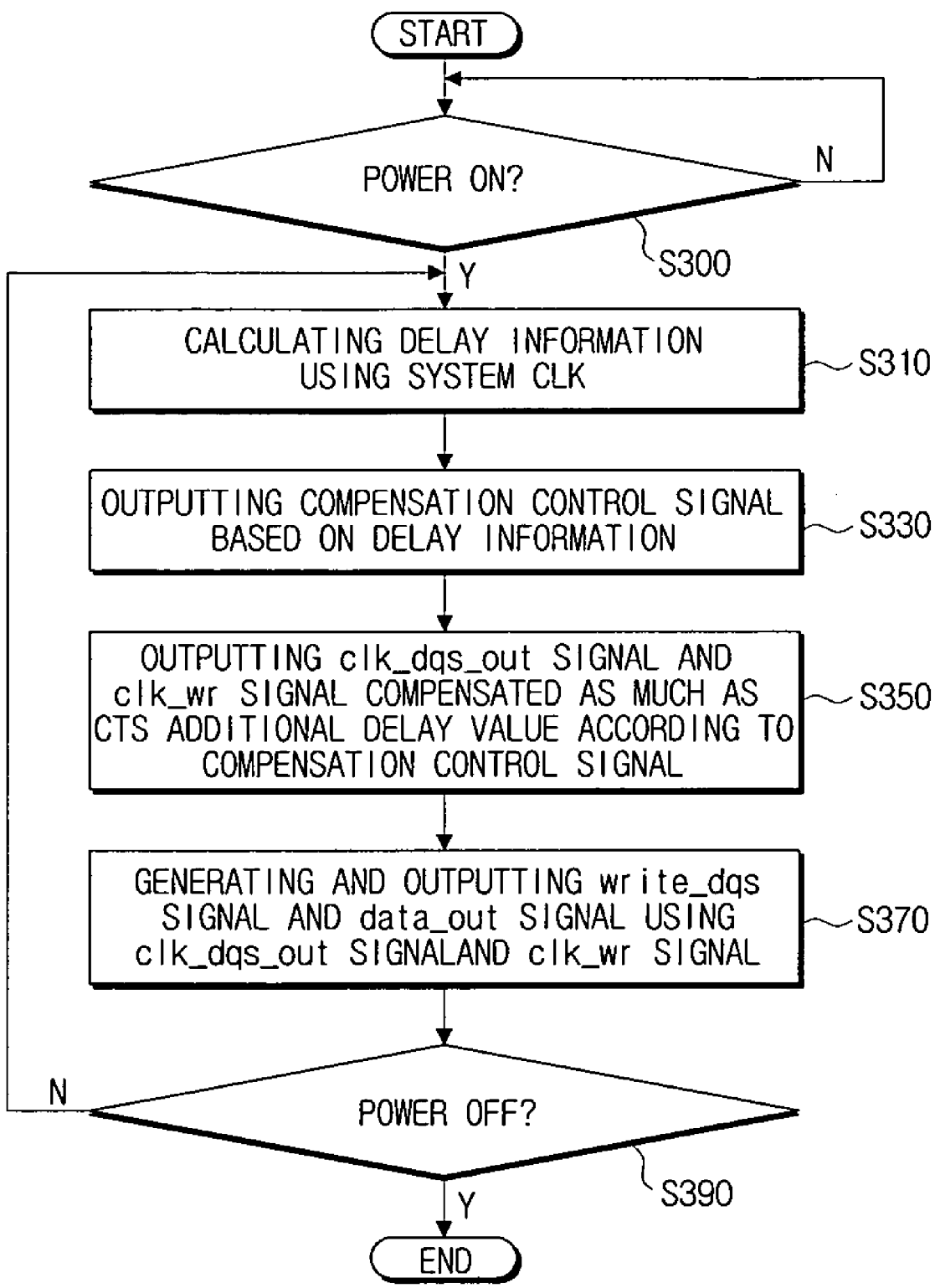
FIG. 5 is a flowchart illustrating an operation of the memory control device according to an exemplary embodiment of the present invention.

FIG. 5 is a flowchart illustrating an operation of the memory control device according to an exemplary embodiment of the present invention.

Referring to FIG. 5, if power is turned on and the ASIC 1 is supplied with power at operation S300, the DCC 110 calculates delay information using the SYSTEM CLK. In other words, the DCC 110 outputs two SYSTEM CLKs having a phase difference therebetween and calculates the delay information that is necessary to delay the SYSTEM CLK for one period. For example, the DCC 110 adjusts the number of delay cells of the phase detector 112 to place one of the first phase SYSTEM CLK or second phase SYSTEM CLK in a high state and the remaining phase SYSTEM CLK in a low state, and calculates the number of delay cells to delay the SYSTEM CLK for one period as the delay information at operation S310.

The compensation unit 120 outputs a compensation control signal using the delay information. That is, the compensation unit 120 refers to a CTS additional delay value stored according to the delay information and outputs the compensation control signal to not pass a clk_dqs_out signal and a clk_wr signal output from the writing control signal generator 118 through a number of delay cells corresponding to the compensation value at operation S330.

Based on the compensation control signal, the writing control signal generator 117 outputs the clk_dqs_out signal and the clk_wr signal that are compensated for as much as the CTS additional delay value according to the changes in the environmental factors. For example, the writing control signal generator 118 estimates the additional delay values of the first CTS 130 and the second CTS 150 and outputs the clk_dqs_out signal and the clk_wr signal that did not pass through the delay cells in the same manner as the CTS additional delay value at operation S350.

Finally, the strobe generator 170 and the data generator 190 generate and output a writ_dqs signal and a data_out signal using the clk_dqs_out signal and the clk_wr signal that are compensated for as much as the CTS additional delay values. For example, the first CTS 130 additionally delays the clk_dqs_out signal and the clk_wr signal so that the clk_dqs_out signal and the clk_wr signal arrive at the strobe generator 170 with the same phase. The second CTS 150 additionally delays the eight-line clk_wr signals provided to the data generator 190 to have the same phase.

The strobe generator 170 and the data generator 190 generate and output the write_dqs signal and the data_out signal, respectively, at operation 370.

If the power is turned off, the operation of the memory control device 100 is complete. However, if the power is still turned on, the operations S310 to S370 are repeatedly performed at operation S390.

As described above, it is possible to prevent the CTS additional delay that is subsequent to the change in the environmental factors.

According to exemplary embodiments of the present invention as described above, the memory control device 100 compensates for an error that occurs due to the change in environmental factors such as voltage, temperature, and noise caused by a transmission channel characteristic when the data is written to the memory, thereby achieving a smooth writing operation.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A memory control device comprising:
   a controller for calculating a number of delay cells that are necessary to delay a system clock for one period as delay information; and
   a compensation unit for generating a compensation control signal by using the delay information calculated by the controller, thereby compensating for an additional delay which is subsequent to a change in environmental factors in at least one of a voltage and temperature.

2. The memory control device as claimed in claim 1, wherein the controller further comprises:
   a phase detector for receiving the system clock and outputting two system clocks comprising a phase difference therebetween;
   a delay controller for calculating the number of delay cells that are necessary to delay the system clock for one period as the delay information, by using the two system clocks comprising the phase difference; and
   a control signal generator for generating a first control signal by passing the system clock through a certain number of delay cells based on the delay information, generating a second control signal to comprise a phase difference in accordance with the first control signal, and outputting the first and the second control signals to interface with a predetermined memory.

3. The memory control device as claimed in claim 2, wherein the control signal generator receives the compensation control signal output from the compensation unit and compensates for an additional delay that is subsequent to an operation of writing data to the memory.

4. The memory control device as claimed in claim 2, further comprising:
   a strobe generator for generating a clock signal to transmit a data to the memory by using the first and the second control signals;
   a data generator for generating a data signal transmitted to the memory by using the second control signal;
   a first additional delayer for additionally delaying one first control signal and one second control signal such that the first and second control signals are input into the strobe generator with the same phase; and
   a second additional delayer for additionally delaying eight-second control signals such that the eight-second control signals are input into the data generator with the same phase.

5. The memory control device as claimed in claim 4, wherein the compensation unit generates the compensation control signal using additional delay values of the first additional delayer and second additional delayer that correspond to the delay information changing depending on the change in the environmental factors.

6. A memory control method comprising:
  calculating a number of delay cells that are necessary to delay a system clock for one period as delay information; and
  generating a compensation control signal by using the delay information calculated by a controller, thereby compensating for an additional delay which is subsequent to a change in environmental factors at least one of a voltage and temperature.

7. The memory control method as claimed in claim 6, wherein the delay information calculation operation comprises:
  receiving the system clock and outputting two system clocks comprising a phase difference therebetween; and
  calculating the number of delay cells that are necessary to delay the system clock for one period by using the two system clocks comprising the phase difference.

8. The memory control method as claimed in claim 6, further comprising:
  receiving the compensation control signal and compensating for an additional delay that is subsequent to an operation of writing data.

* * * * *